United States Patent
Tokuda et al.

(10) Patent No.: US 8,895,341 B2
(45) Date of Patent: Nov. 25, 2014

(54) METHOD OF MANUFACTURING RADIATION DETECTOR

(71) Applicant: Shimadzu Corporation, Kyoto (JP)

(72) Inventors: Satoshi Tokuda, Kyoto (JP); Toshinori Yoshimuta, Kyoto (JP); Hiroyuki Kishihara, Kyoto (JP); Masatomo Kaino, Kyoto (JP); Akina Yoshimatsu, Kyoto (JP); Takahiro Doki, Kyoto (JP); Toshiyuki Sato, Kyoto (JP)

(73) Assignee: Shimadzu Corporation, Kyoto (JP)

( * ) Notice: Subject to any disclaimer, the term of this patent is extended or adjusted under 35 U.S.C. 154(b) by 73 days.

(21) Appl. No.: 13/784,117

(22) Filed: Mar. 4, 2013

(65) Prior Publication Data
US 2014/0080243 A1    Mar. 20, 2014

(30) Foreign Application Priority Data
Sep. 14, 2012 (JP) .................. 2012-202723

(51) Int. Cl.
*H01L 31/18* (2006.01)

(52) U.S. Cl.
CPC ............ *H01L 31/1864* (2013.01); *H01L 31/18* (2013.01)
USPC ............................................. 438/56

(58) Field of Classification Search
None
See application file for complete search history.

(56) References Cited

U.S. PATENT DOCUMENTS

| | | | | |
|---|---|---|---|---|
| 4,343,881 A | * | 8/1982 | Sher et al. | 430/57.5 |
| 2004/0094721 A1 | | 5/2004 | Tokuda et al. | |
| 2011/0155208 A1 | * | 6/2011 | Wang | 136/244 |

FOREIGN PATENT DOCUMENTS

JP  4269653  3/2009

* cited by examiner

*Primary Examiner* — Seahvosh Nikmanesh
(74) *Attorney, Agent, or Firm* — McDermott Will & Emery LLP

(57) ABSTRACT

A method of manufacturing a radiation detector, comprising: a charge blocking layer generating step of generating a charge blocking layer on a substrate; a CdTe-layer generating step of generating a CdTe layer so as to cover the charge blocking layer on the substrate, the CdTe layer undergoing heterojunction to the charge blocking layer and being composed of a chlorine-doped polycrystalline film; and a heat treatment step of performing a heat treatment on the substrate having the CdTe layer formed thereon.

16 Claims, 6 Drawing Sheets

HEAT TREATMENT

PRIOR TO HEAT TREATMENT

SUBSEQUENT TO HEAT TREATMENT AT 350°C4h

HEAT TREATMENT AT 250°C/ FOR FOUR HOURS

HEAT TREATMENT AT 350°C/ FOR FOUR HOURS

Prior art

METHOD OF MANUFACTURING RADIATION DETECTOR

RELATED APPLICATIONS

This application claims the benefit of priority of Japanese Application No. 2012-202723, filed on Sep. 14, 2012, the disclosure of which Application is incorporated by reference herein.

BACKGROUND

1. Field of the Invention

This invention relates to a method of manufacturing a radiation detector including a conversion layer for converting radiation into charges.

2. Description of the Related Art

Radiation detectors that image radiation are used in various fields including a medical field. Here, description will be given in detail of a construction of such a radiation detector. As illustrated in FIG. 11, a conventional radiation detector 60 includes a CdTe layer 51 for converting radiation into carriers of electron-hole pairs, a sensor substrate formed by charge blocking layers 52 and 57 laminated so as to cover both surfaces of the CdTe layer 51, and a glass active matrix substrate 54. A layer including CdTe layer 51, the charge blocking layers 52 and 57 is connected to the active matrix substrate 54 via conductive carbon bump electrodes formed on pixel electrodes of the active matrix substrate 54.

The CdTe layer 51 is a conversion layer that converts radiation into charges. The layer largely contributes to manufacturing the radiation detector 60 of high performance. This is because lower or non-uniform conversion efficiency of converting radiation into charges in the Cd Te layer 51 may cause a decreased detecting property of the radiation detector 60.

Regarding this state, various approaches of generating a CdTe layer 51 of higher performance than before have been developed. For instance, such a design is given as doping the CdTe layer 51 with chlorine to generate a high-performance CdTe layer 51. See, for example, Japanese Patent No. 4269653.

Specifically, such a CdTe layer is formed on a substrate by closed spaced sublimation. At this time, $CdCl_2$ is mixed with a material or a chlorine-containing gas is introduced into the material in gaseous phase, whereby a chlorine-doped Cd Te layer is generated. Doping with chlorine allows enhanced performance of the radiation detector.

The CdTe layer generated in such a manner has minute assembled crystals, and is called a polycrystalline film. The method of generating the CdTe layer of the polycrystalline film is advantageous to manufacturing the radiation detector having a large area.

Moreover, the CdTe layer may be doped with zinc for increasing performance thereof. In this case, the CdTe layer is doped with chlorine and zinc.

The conventional configuration as above, however, has the following drawbacks.

That is, merely doping the Cd Te layer with chlorine as conventional leads to insufficiently enhanced performance of the CdTe layer.

That is, the conventional manufacturing method has a drawback that each section of the radiation detector fails to have a uniform detecting property. It has been known that an interface between the CdTe layer and the charge blocking layers manufactured by the conventional method contains a Zn-rich region appearing therein. The Zn-rich region appears in the interface as an uneven block, and causes a non-uniform electric conduction property and the like in the interface. Such the uneven interface may result in a non-uniform conversion property of radiation or a non-uniform collection property of carriers.

There also arises a drawback that the CdTe layer 51 is insufficiently changed into N-type. Originally, the CdTe layer 51 operates by heterojunction of the CdTe layer 51 and the charge blocking layer 52. That is, the CdTe layer 51 and the charge blocking layer 52 are preferably formed into like a diode. For that purpose, the CdTe layer 51 should be certainly an N-type semiconductor. On the other hand, since the conventional construction includes the CdTe layer 51 doped with chlorine, the CdTe layer 51 seems to be certainly changed into N-type.

However, in actual, the CdTe layer 51 is not changed into N-type sufficiently considering an amount of doped chlorine atoms. That is, the conventional construction of the radiation detector achieves insufficient semiconducting properties of the CdTe layer 51, leading to reduction in detectability of the radiation detector.

SUMMARY

This invention has been made regarding the state of the art noted above, and its object is to manufacture a radiation detector having increased radiation detectability by enhancing properties of a CdTe layer.

This invention is constituted as stated below to achieve the above object. One example of the invention discloses a method of manufacturing a radiation detector. The method includes a charge blocking layer generating step of generating a charge blocking layer on a substrate; a CdTe-layer generating step of generating a CdTe layer so as to cover the charge blocking layer on the substrate, the CdTe layer undergoing heterojunction to the charge blocking layer and being composed of a chlorine-doped polycrystalline film; and a heat treatment step of performing a heat treatment on the substrate having the CdTe layer formed thereon.

The method of manufacturing the radiation detector according to the example of the invention includes the heat treatment step of performing a heat treatment on the CdTe layer composed of the chlorine-doped polycrystalline film. Such a heat treatment as in the example of the invention causes chlorine atoms to be placed on a Te-site of a crystal lattice, the CdTe layer being doped with the chlorine atoms. This achieves a CdTe layer of N-type reliably. Accordingly, heterojunction occurs between the CdTe layer and the charge blocking layer, resulting in reliable collection of charges generated in the CdTe layer. Thus, the radiation detector having high sensitivity can be manufactured.

The heat treatment achieves an even CdTe layer. That is, when a ZnTe film is used as the charge blocking layer, a Zn-rich region appearing in the interface between the CdTe layer and the charge blocking layer is eliminated by the heat treatment. Elimination of the construction as above means that the interface between the CdTe layer and the charge blocking layer becomes even. The uneven interface may cause a non-uniform conversion property of radiation or a non-uniform collection property of carriers. Regarding this, the heat treatment of the example of the invention can reduce non-uniformity in detecting property of the radiation detector to be manufactured.

Moreover, the CdTe layer composed of the polycrystalline film has a drawback that charge movement is readily prevented on an interface of crystals adjoining each other. Then, the heat treatment of the example of the invention increases an electron density in the CdTe layer, resulting in promotion of the charge movement among crystals. Consequently, the charges generated in the CdTe layer can be collected reliably.

Moreover, in the CdTe-layer generating step in the method of generating the radiation detector mentioned above, the CdTe layer is preferably doped with zinc in addition to chlorine.

The aforementioned construction is one example applicable to the manufacturing method of this invention. As noted above, this invention is applicable to various types of radiation detectors. In addition, the heating treatment of this invention can eliminate an uneven Zn-rich region generated in the interface between the CdTe layer and the ZnTe film (charge blocking layer).

Moreover, the heat treatment step in the method of manufacturing the radiation detector mentioned above is preferably performed in an inert gas atmosphere.

The above construction describes in more detail the manufacturing method of this invention. That is, the heat treatment in the inert gas atmosphere can prevent deterioration of the CdTe layer, resulting in manufacturing the radiation detector having higher quality.

Moreover, the heat treatment step in the method of manufacturing the radiation detector mentioned above is preferably performed for four hours or more within thirty hours.

The above construction describes in more detail the heat treatment step of this invention. The heat treatment step performed at a processing time of four hours or more within thirty hours proves that physical properties of the CdTe layer significantly vary.

Moreover, in the heat treatment step in the method of manufacturing the radiation detector noted above, the heat treatment is preferably performed at a temperature of 250° C. or more to 500° C. or less.

The above construction describes in more detail the heat treatment step of this invention. The heat treatment step performed at a processing temperature of 250° C. or more to 500° C. or less proves that physical properties of the CdTe layer significantly vary. Moreover, the CdTe layer of this invention can resist at 500° C. reliably. Accordingly, the CdTe layer can be heated up to 500° C.

The method of manufacturing the radiation detector according to the example of the invention includes the heat-treatment step of performing the heat treatment on the CdTe layer composed of the chlorine-doped polycrystalline film. The heat treatment as above can eliminate the Zn-rich region appearing in the interface between the CdTe layer and the charge blocking layer. Moreover, chlorine atoms with which the CdTe layer is doped are placed on the Te-site of the crystal lattice, resulting in changing of the CdTe layer into N-type. Accordingly, the CdTe layer becomes even and has enhanced properties, whereby the charges generated in the CdTe layer can be collected reliably. Then a high-sensitive radiation detector can be manufactured.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

DETAILED DESCRIPTION

Upon explanation of a method of manufacturing a radiation detector according to one example of the invention, description will be given firstly of a construction of a radiation detector according to the example of the invention.

Figure 1:
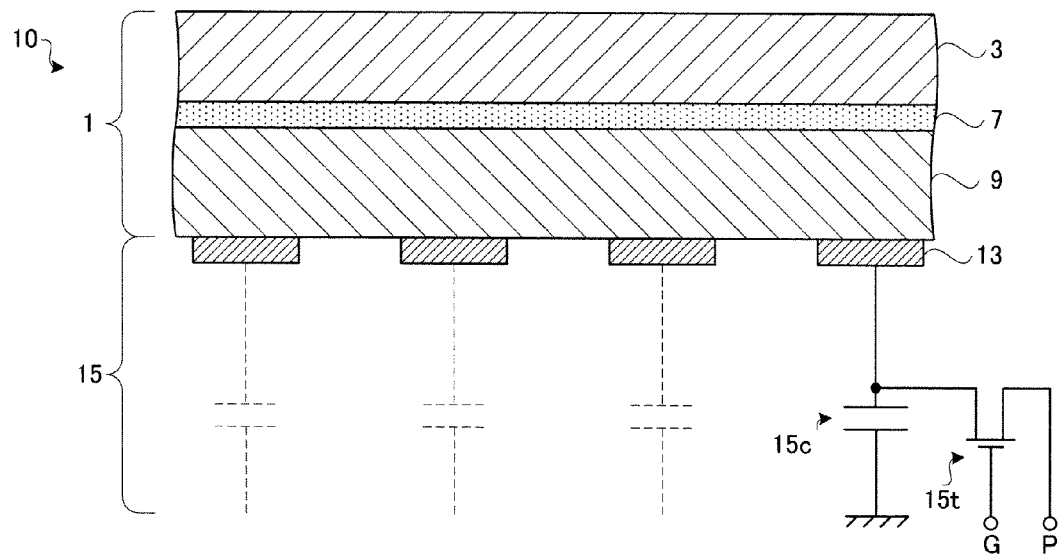
FIG. 1 is a sectional view illustrating a construction of a radiation detector according to one example of the invention.

As illustrated in FIG. 1, a radiation detector 10 includes a conversion module 1 having a function of converting radiation into electric signals. The conversion module 1 includes a support substrate 3 capable of transmitting radiation and composed of graphite, an electron-injection blocking layer 7 laminated on a lower surface the support substrate 3, and a conversion layer 9 further laminated below the support substrate 3 for generating electron-hole pair carriers in response to incident radiation. The support substrate 3, the electron-injection blocking layer 7, and the conversion layer 9 are laminated in this order. The conversion layer 9 is electrically connected to pixel electrodes 13 for carrier collection. The pixel electrode 13 belongs to an active matrix substrate 15 to be mentioned later. The support substrate 3 corresponds to the substrate in this invention. The electron-injection blocking layer 7 corresponds to the charge blocking layer in this invention. The conversion layer 9 corresponds to the CdTe layer in this invention.

The electron-injection blocking layer 7 is preferably made of a material having P-type conductivity and high resistance. For instance, the electron-injection blocking layer 7 is composed of ZnTe and the like.

The conversion layer 9, preferably, is manufactured as described hereinafter. The conversion layer 9 is formed of a polycrystalline film consisting of either CdTe or CdZnTe, or a polycrystalline laminated film including at least one selected from CdTe and CdZnTe, and is further doped with Cl.

Moreover, carbon can be selected for example as a material of the pixel electrode 13.

As illustrated in FIG. 1, the radiation detector 10 having the above construction includes the conversion module 1 integrated with an active matrix substrate 15 to function as radiographic apparatus. Consequently, carriers generated in the conversion layer 9 of the radiation detector 10 are collected on a pixel element basis by the active matrix substrate 15, and are stored for different pixel elements to be read as electric signals.

The active matrix substrate 15 includes the pixel electrodes 13 for carrier collection formed on the glass substrate. The pixel electrodes 13 contact the conversion layer 9, and are arranged two-dimensionally on a surface of the active matrix substrate 15. The pixel electrode 13 is connected to a capacitor 15c for charge collection, as illustrated in FIG. 1. Charges collected in the pixel electrode 13 are accumulated in a capacitor 15c. The capacitor 15c is connected to a transistor 15t. The transistor 15t has a gate G for current control and a read-out electrode P for reading out detection signals besides an input terminal connected to the capacitor 15c. When the gate G of the transistor 15t is turned on, charges accumulated in the capacitor 15c flow toward the read-out electrode P.

Figure 2:
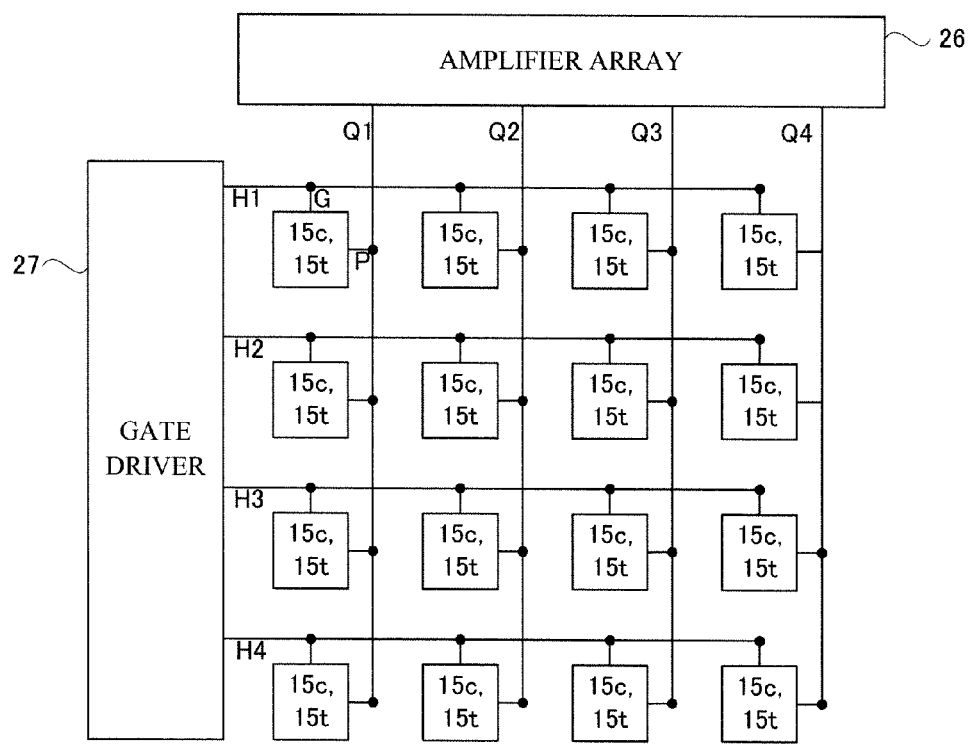
FIG. 2 is a schematic view illustrating the construction of the radiation detector according to the example of the invention.

The transistors 15t arranged two-dimensionally are connected to wires extending vertically and horizontally in a lattice shape. Specifically, read-out electrodes P of the transistors 15t arranged in the vertical direction in FIG. 2 are each connected to any of common amplifying electrodes Q1 to Q4. The gates G of the transistors 15t arranged in the horizontal direction in FIG. 2 are each connected to any of common gate control electrodes H1 to H4. The gate control electrodes H1 to H4 are connected to a gate driver 27. The amplifier electrodes Q1 to Q4 are connected to an amplifier array 26. A pixel is formed by the capacitor 15c, the transistor 15t, and the gates G. As mentioned above, the pixels are arranged two-dimensionally in the active matrix substrate 15. The gate driver 27 controls an electric potential of the gate G turning the transistors 15t on/off.

Description will be given of a configuration of reading out the charges accumulated in each capacitor 15c. Here, it is assumed that the charges are accumulated in each of the capacitors 15c in FIG. 2. The gate driver 27 turns on the transistors 15t simultaneously via the gate control electrode H1. The four transistors 15t turned on and located in the horizontal direction transmit charges (original signals) to the amplifier array 26 via the amplifying electrodes Q1 to Q4.

Next, the gate driver 27 turns on the transistors 15t simultaneously via the gate control electrode H2. In this way, the gate driver 27 turns on the gate control electrodes H1 to H4 in turn. The transistors 15t arranged in the same lines are turned on each time. In this way, the radiation detector 10 reads out the charges accumulated in each capacitor 15c for every line.

The amplifier array 26 has an amplifier in each of the amplifying electrodes Q1 to Q4 for amplifying signals. The original signals inputted from the amplifying electrodes Q1 to Q4 into the amplifier array 26 are amplified by a given amplification factor.

The pixel electrode 13, the capacitor 15c and the transistor 15t form an X-ray detecting element that detects X-rays. The X-ray detecting elements form a two-dimensional matrix of 3,072 by 3,072 on the active matrix substrate 15.

Figure 3:
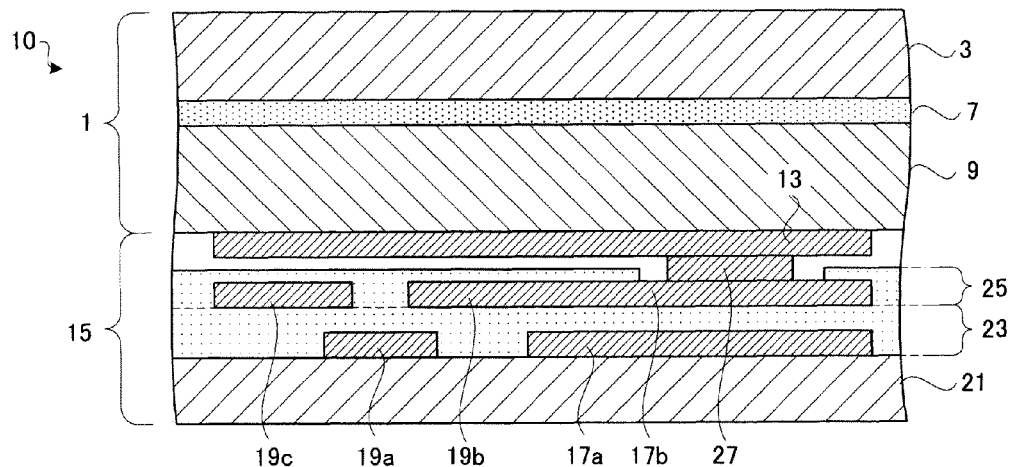
FIG. 3 is a sectional view illustrating the construction of the radiation detector according to the example of the invention.

FIG. 3 illustrates a detailed construction of the active matrix substrate 15. Specifically, an earth-side electrode 17a of the condenser 15c is laminated on an upper surface of an insulation support substrate 21. A connection-side electrode 17b of the condenser 15c is laminated on the earth-side electrode 17a via an insulation film 23. Similarly, source and drain electrodes 19b and 19c of the transistor 15t are laminated on the gate electrode 19a of the transistor 15t via an insulation film 23. Further, an insulation film 25 for protection is arranged on an upper surface of the insulation film 23, a part of the connection-side electrode 17b, and drain electrodes 19c.

Moreover, the connecting-side electrode 17b and the source electrode 19b are formed simultaneously and made conductive. As for the insulation films 23 and 25, a plasma SiN film is employable, for example. The radiation detector 10 and active matrix substrate 15 are connected together by pressure bonding with carbon bump electrodes, an anisotropic conductive film (ACF), an anisotropic conductive paste (ACP) or the like being disposed therebetween. Consequently, the radiation detector 10 and active matrix substrate 15 are bonded together to be integral with each other. At this time, the pixel electrode 13 and the connection-side electrodes 17b are made conductive by an interposed conductive portion 27.

Next, detailed description will be given of a method of manufacturing the above radiation detector 10.

The electron-injection blocking layer 7 of the radiation detector 10 is laminated by a method such as sputtering or vapor deposition. This process is called an electron-injection blocking layer generating step S1. The electron-injection blocking layer generating step S1 is a step of generating the electron-injection blocking layer 7 on the substrate, the layer blocking passages of charges. Then the conversion layer 9 is formed by "closed spaced sublimation" as under on the under surface of the electron-injection blocking layer 7. This process is called a conversion-layer generating step S2. The conversion-layer generating step S2 is a step of generating the conversion layer 9 so as to cover the electron-injection blocking layer 7 on the substrate, the conversion layer 9 undergoing heterojunction to the electron-injection blocking layer 7 and being composed of the chlorine-doped polycrystalline film. The electron-injection blocking layer generating step S1 corresponds to the charge blocking layer generating step in this invention. The conversion-layer generating step S2 corresponds to the CdTe-layer generating step in this invention.

Specifically, in the conversion-layer generating step S2, the support substrate 3 is placed within a vapor deposition chamber 33. Since a lower susceptor 35 for placing a source S is provided within the vapor deposition chamber 33, the support substrate 3 is placed via a spacer 37 while a vapor-deposition surface of the support substrate 3 is directed downward. Heaters 39 are provided above and below the vapor-deposition chamber 33. A vacuum pump connected to the vapor-deposition chamber 33 operates to reduce the pressure of the atmosphere within the chamber 33. Thereafter, the heaters 39 above and below heat the source S. Consequently, the source S sublimates and adheres on the under surface of the support substrate 3 to form the conversion layer 9. Here, the conversion layer 9 is formed having a thick film of 100 μm or more.

Examples of the source S set in the lower susceptor 35 include a mixture of a first material containing at least one selected from CdTe (cadmium telluride) and CdZnTe (cadmium telluride zinc) and a second material containing at least one selected from $CdCl_2$ (cadmium chloride) and $ZnCl_2$ (zinc chloride). Moreover, gas containing chlorine in the gaseous phase may be introduced into the chamber as a source of chlorine. In this way, the conversion module 1 is formed through the above processes. Moreover, in the conversion-layer generating step S2, the conversion layer 9 may be doped with zinc in addition to chlorine.

Figure 4:
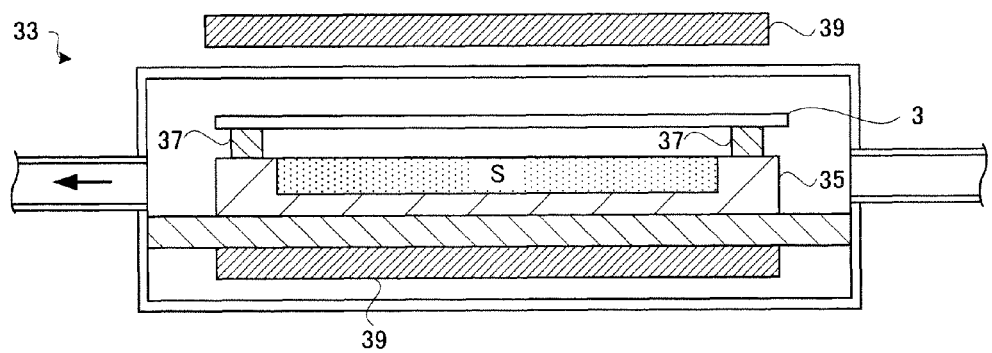
FIG. 4 is a sectional view illustrating a method of manufacturing the radiation detector according to the example of the invention.

Subsequently, the conversion module 1 is inserted in a baking furnace similar to that in FIG. 4 to undergo a heat treatment. The heat treatment is the most characteristic in this invention. This process is called a heat treatment step S3. The heat treatment step S3 is a step of performing a heat treatment on the support substrate 3 having the conversion layer 9 generated thereon.

In the heat treatment step S3, the heat treatment is performed on the conversion module 1 under a temperature within the baking furnace set to be from 250° C. or more to 500° C. or less. The temperature is preferably selected from a range of 250° C. or more to 380° C. or less. Time for performing the heat treatment is selected from a range of four hours or more to thirty hours or less. Inert gas is introduced into the baking furnace during the heat treatment. Specifically, rare gas such as Ar and helium or $N_2$ may be selected as the inert gas. The baking furnace preferably has a pressure of around an atmospheric pressure. The conversion module 1 is formed by the heat treatment. Thus, the heat treatment step S3 is performed under the inert gas atmosphere. In addition, the heat treatment step S3 is performed for four hours or more within thirty hours. Moreover, the heat treatment in the heat treatment step S3 is performed at the temperature of 250° C. or more to 500° C. or less.

As described above, the active matrix substrate 15 and the conversion module 1 are integrated to complete the radiation detector 10.

Next, description will be given of the importance of performing the heat treatment on the conversion module 1. When the heat treatment is performed on the conversion module 1, the physical properties of the conversion layer 9 vary. That is, positions of the chlorine atom with which the conversion layer 9 is doped are changed.

Figure 5:
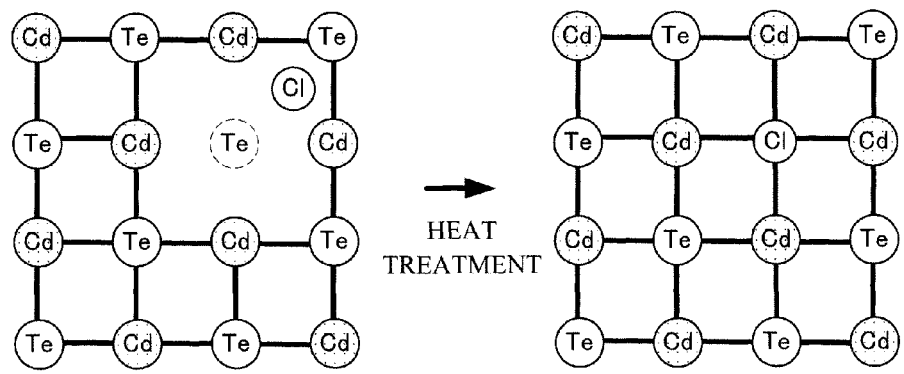
FIG. 5 is a schematic view illustrating an effect of a heat treatment according to the example of the invention.

FIG. 5 illustrates on the left side thereof a condition of the conversion layer 9 prior to the heat treatment. The conversion layer 9 is a polycrystalline film, and thus minute crystals are laminated to form the layer 9. Accordingly, it can be regarded that the conversion layer 9 is formed of crystals microscopically. Regarding this point of view, it can be considered that Cd atoms and Te atoms forming the conversion layer 9 are arranged on a specific crystal lattice.

Some Cl atoms in the conversion layer 9 are located in a gap of the crystal lattice without being involved in bond of the crystal lattice. Such the Cl atoms exert no influence on the physical properties of the conversion layer 9. On the other hand, the conversion layer 9 is doped with chlorine upon lamination so as to be changed into N-type for obtaining enhanced conductivity. However, in the actually generated conversion layer 9, the doped chlorine atoms insufficiently enter into the crystal lattice, and thus the conversion layer 9 is not sufficiently changed into N-type.

FIG. 5 illustrates on the right hand thereof the conversion layer 9 subsequent to the heat treatment. It can be recognized that the Cl atoms not involved in the bond of the crystal lattice on the left side of FIG. 5 are located on a Te-site by the heat treatment. Such a phenomenon occurs, whereby electrons of the Cl atom enable to move through the crystal lattice. In other words, the conversion layer 9 comes to have the physical properties of an N-type semiconductor.

As mentioned above, when the heat treatment is performed on the conversion layer 9, the conversion layer 9 is sufficiently changed into N-type. This achieves the enhanced conductivity of the conversion layer 9. When radiation enters into the conversion layer 9, carrier pairs will be generated there. The carrier pair is an electric signal indicating incidence of radiation. When the conversion layer 9 has the enhanced conductivity, the electric signals can flow readily into the pixel element electrode 13 for carrier collection. Accordingly, the heat treatment to the conversion layer 9 in this way allows manufacturing of the conversion module 1 of higher performance.

<Verification for Validity of Heat Treatment: Generation of Rectification>

Figure 6:
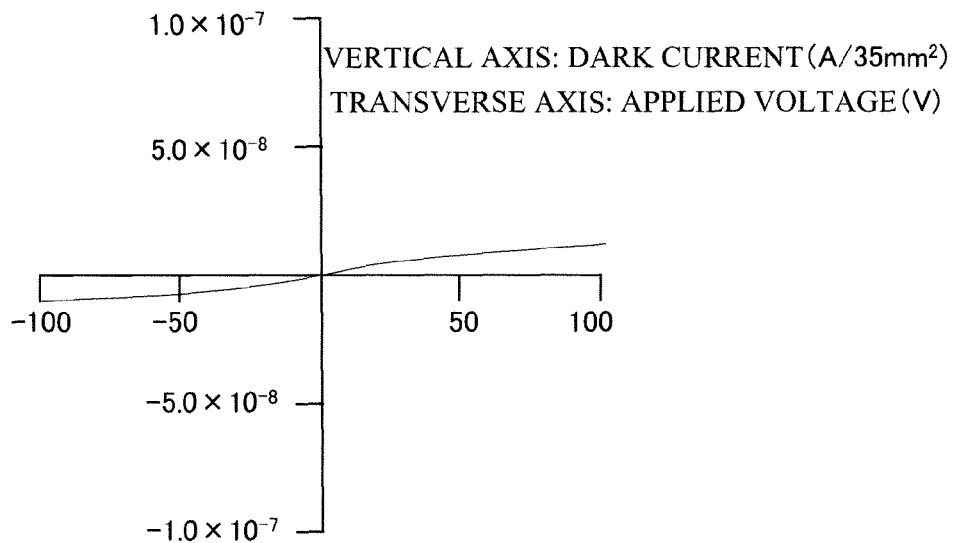
FIGS. 6 to 9 are graphs each illustrating the experimental result that proves the effect of the heat treatment according to the example of the invention.
Figure 6:
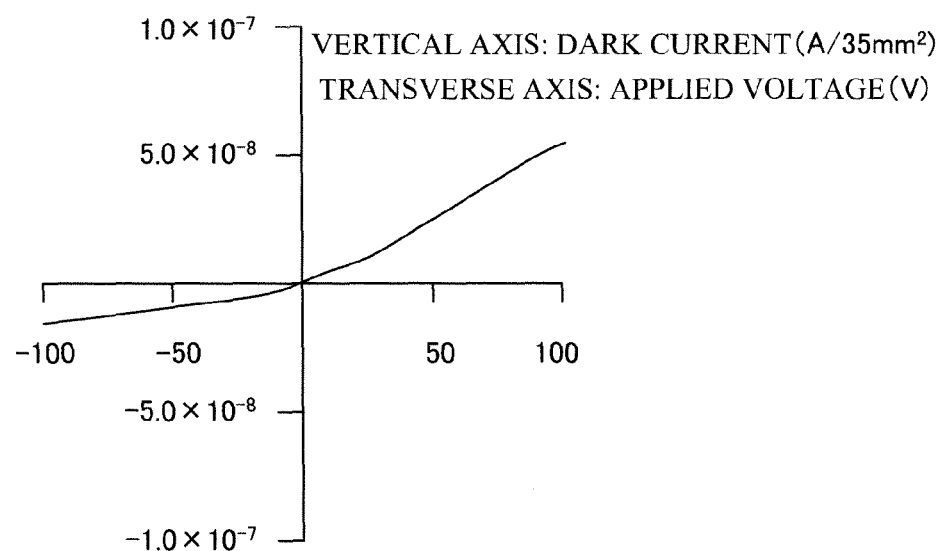

Subsequently, experiments were conducted to show that the heat treatment on the conversion layer 9 is effective. Description will be given of the experiments. FIG. 6 illustrates is I-V characteristic when direct current flows through the conversion module 1. FIG. 6 illustrates on the up side thereof the conversion module 1 prior to the heat treatment. FIG. 6 illustrates on the down side thereof the conversion module 1 subsequent to the heat treatment. The conversion layer 9 is a CdZnTe layer with which Zn is doped. The heat treatment was performed at 350° C. for four hours. It is assumed that current flows from the support substrate 3 to the conversion layer 9 of the conversion module 1 and the current in this direction is current in a forward direction.

It is apparent from the up side of FIG. 6 that current hardly flows with variations in potential. This means that current is hard to flow since the conversion layer 9 is insufficiently changed into N-type. On the other hand, it is apparent from the down side of FIG. 6 that as voltage is applied to the conversion module in the forward direction, high current flows accordingly. When current is applied to the conversion module 1 in a backward direction, not much high current flows. This means that the heat treatment causes rectification in the conversion module 1. In other words, the conversion module 1 subsequent to the heat treatment has a function as a diode. Taking into consideration that the electron-injection blocking layer 7 is formed of a P-type semiconductor, such rectification does not appear as long as the conversion layer 9 is changed into N-type through the heat treatment. That is, it can be said from the results of FIG. 6 that the conversion layer 9 is changed into N-type through the heat treatment to the conversion module 1.

As noted above, current readily flows in the conversion module 1 in the forward direction. Accordingly, this means that carriers generated in the conversion layer 9 readily flow toward the pixel electrodes 13. Considering this result, it is considered that the conversion module 1 has enhanced ability of carrier collection by the heat treatment.

<Verification for Validity of Heat Treatment: Relationship Between Processing Temperature and Time and Increased Current>

Figure 7:
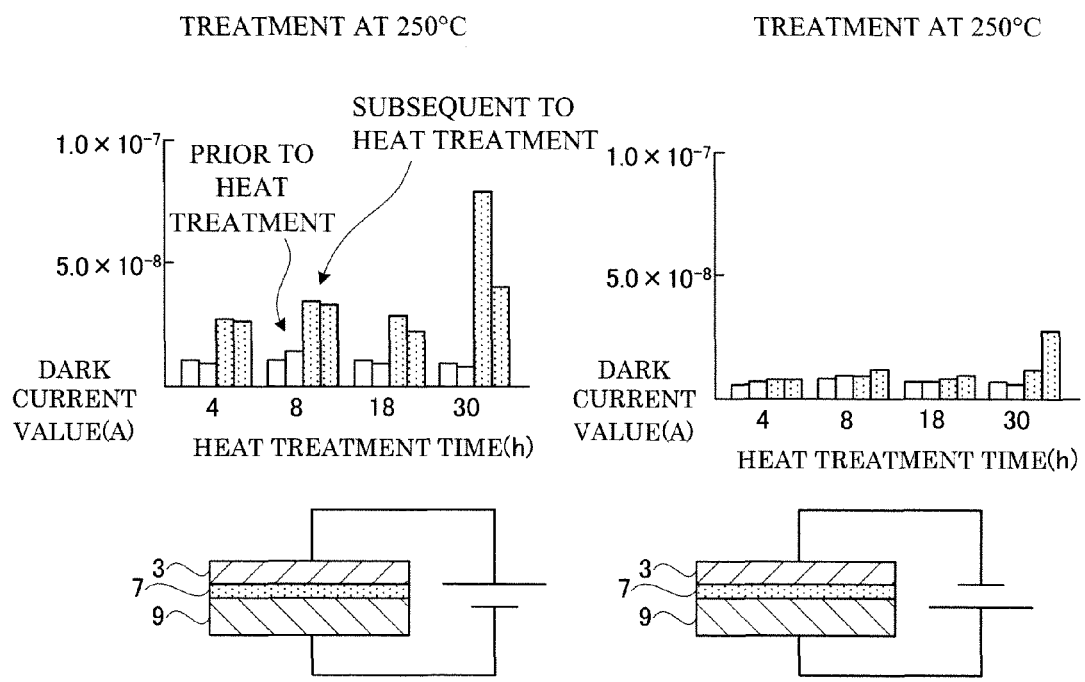

Subsequently, description will be given of results obtained by experiments similar as the aforementioned ones with different processing temperatures and processing times. FIG. 7 illustrates dark current flowing upon application of voltage to the conversion module 1 prior to the heat treatment and that subsequent to the heat treatment. The conversion layer 9 used for the experiments is also a CdZnTe layer. The graph includes non-shading portions indicating a sample prior to the heat treatment and shading portions indicating a sample subsequent to the heat treatment. Here, dark current is detected when no radiation enter into the conversion layer 9. Too high dark current causes reduction of noises or dynamic ranges.

The experiments were conducted under the following conditions. The heat treatment was performed for four types of time, i.e., for four hours, eight hours, eighteen hours, and thirty hours. The heat treatment was performed at a temperature of 250° C. The graph at the upper left of FIG. 7 indicates a result when voltage is applied from the support substrate 3 to the conversion layer 9 in a forward direction, as illustrated in the lower left of FIG. 7. The graph at the upper right of FIG. 7 indicates a result when voltage is applied from the support substrate 3 to the conversion layer 9 in a backward direction, as illustrated in the lower right of FIG. 7. The applied voltage was 100V.

The results show that current in the conversion module 1 readily flows in the forward direction by the heat treatment. On the other hand, current in the backward direction does not flow readily by the heat treatment in comparison with that in the forward direction. In other words, the conversion module 1 is considered to have a function as a diode by the heat treatment. That is, it can be said that the conversion layer 9 can collect the carriers effectively generated therein toward the pixel electrodes 13 without increasing leakage current.

Figure 8:
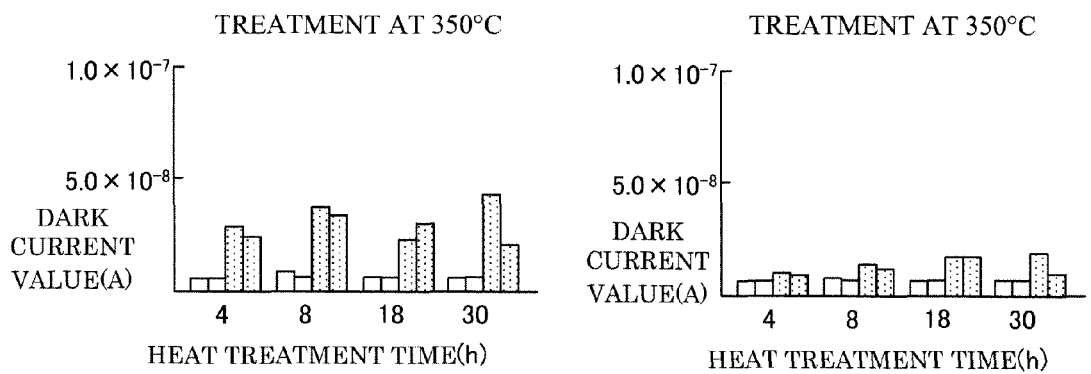

FIG. 8 illustrates similar experiments as above. Provided that the heat treatment was performed at a temperature of 350° C. The graph at the upper left of FIG. 8 indicates a result when voltage is applied in the forward direction, as illustrated in the lower left of FIG. 7. The graph at the upper right of FIG. 8 indicates a result when voltage is applied in the backward direction, as illustrated in the lower right of FIG. 7. The results were same as the above-mentioned results.

From above, it is recognized that the conversion layer 9 has improved properties at any heating times of four hours or more within thirty hours and at the heating temperatures of 250° C. or more up to 350° C. or less.

<Verification for Validity of Heat Treatment: Results of Photoluminescence Spectra>

It is observed that the properties of the conversion layer 9 have been improved by photoluminescence-spectrum measurement. Thus, description will be given next of this. Photoluminescence analysis measures wavelengths and intensity of fluorescence emitted while excited electrons return to a normal condition, the excited electrons being generated by applying laser beams to a sample formed by a material including electrons. The sample in the measurement corresponds to the conversion layer 9 prior and subsequent to the heat treatment. The conversion layer 9 used for the experiment is also a CdZnTe layer.

Description will be given of measurement conditions. The measurement was performed at a temperature of 20 K. For a spectroscope, a Back-thinned Type CCD linear imaging sensor PMA-11 manufactured by Hamamatsu Photonics K.K. was used. This apparatus has a wavelength resolution of 2.5 nm and a measured wavelength range of 350 nm to 1,100 nm.

Figure 9:
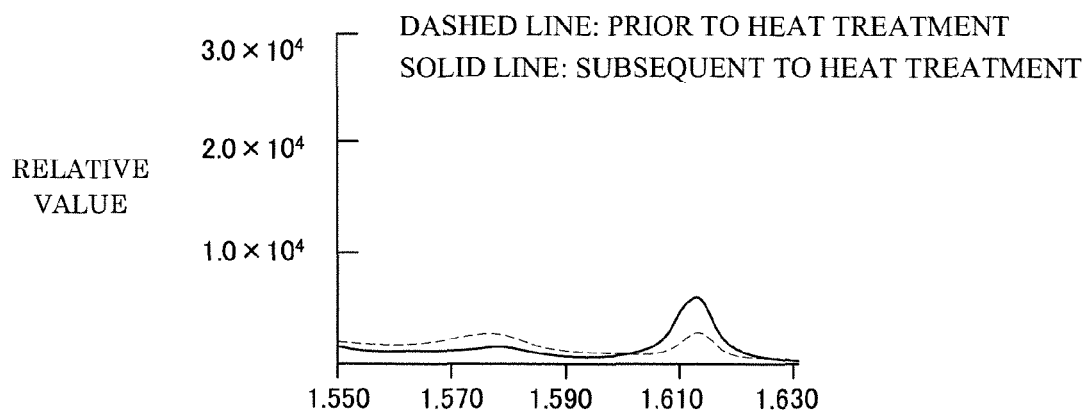
Figure 9:
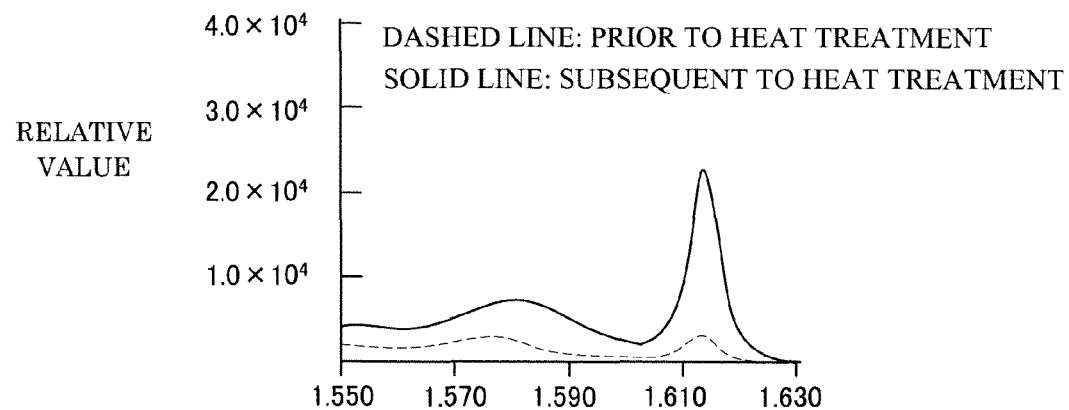

FIG. 9 illustrates the experimental results. FIG. 9 has a transverse axis indicating energy (eV) and a vertical axis indicating a relative value expressing intensity of fluorescence. FIG. 9 illustrates on the up side thereof variations in property of the conversion layer 9 when the heat treatment was performed at 250° C. for four hours. The dashed line in the graph indicates a spectrum prior to the heat treatment, whereas the solid line indicates a spectrum subsequent to the heat treatment. Similarly, FIG. 9 illustrates on the down side thereof variations in property of the conversion layer 9 when the heat treatment was performed at 350° C. for four hours.

The results shows that the peak of an excited region with energy of 1.612 eV increased by the heat treatment. It is considered that this occurred due to increased density of the electrons in the conversion layer 9. Here, the reason for the increased density of the electrons is to be studied. It is considered that the heat treatment changes no configuration itself of the material of the conversion layer 9. That is, such the results are obtained because relocation of the chlorine atoms illustrated in FIG. 5 causes free movement of electrons in the chlorine atoms within the crystals of the conversion layer 9.

In addition to this, a phenomenon is observed that, as illustrated by a table below, the heat treatment shifted the excited region and a region of DAP luminescence in a direction of higher energy. This proves that the properties of the conversion layer 9 varied with the heat treatment.

|  | Exciton (eV) | D-A (eV) | 1.4 eV band(eV) |
|---|---|---|---|
| Heat treatment at 250, 4 hours |  |  |  |
| prior to heat treatment | 1.612 | 1.575 | 1.46 |
| subsequent to heat treatment | 1.612 | 1.578 | 1.46 |
| Heat treatment at 350, 4 hours |  |  |  |
| prior to heat treatment | 1.612 | 1.575 | 1.46 |
| subsequent to heat treatment | 1.614 | 1.581 | 1.46 |

<Verification for Validity of Heat Treatment: Observation with Electron Microscope>

Figure 10:
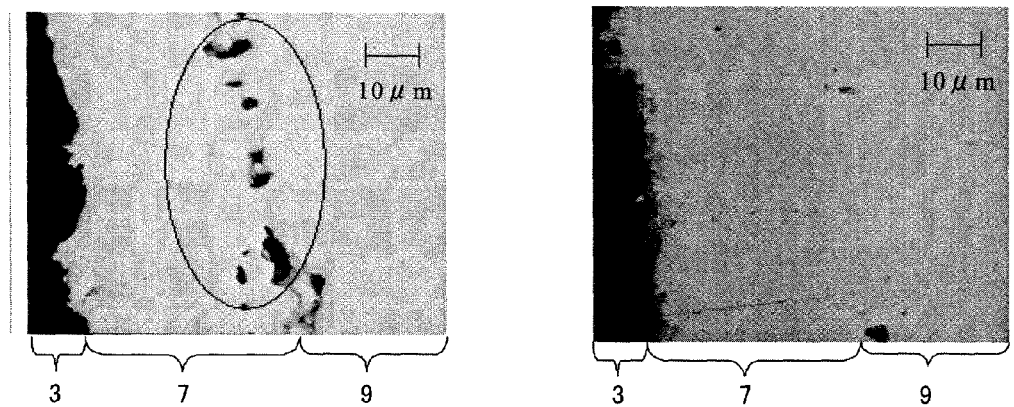
FIG. 10 is a microphotograph illustrating the experimental result that proves the effect of the heat treatment according to the example of the invention.
Figure 11:
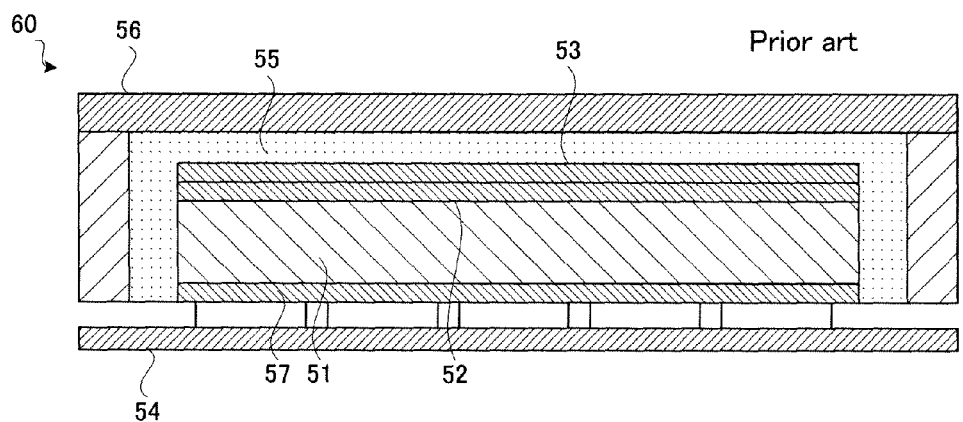
FIG. 11 is a sectional view illustrating a conventional construction of a radiation detector.

FIG. 10 illustrates the results of observing a section of the conversion module 1 with an electron microscope. FIG. 10 illustrates on the left side thereof the conversion module 1 prior to the heat treatment and on the right side thereof the conversion module 1 subsequent to the heat treatment. The heat treatment was performed at a processing temperature of 350° C. for four hours. The conversion layer 9 used for the experiment is also a CdZnTe layer.

The result shows that a black object within a frame expressed by an ellipse on the left side of FIG. 10 disappears subsequent to the heat treatment. The black object corresponds to the Zn-rich region and is known in advance as unevenness appearing upon covering the conversion layer 9. Disappearance of such the object means that the interface between the electron-injection blocking layer 7 and the conversion layer 9 has been even. The unevenness inside the conversion layer 1 may cause a non-uniform conversion property of radiation or a non-uniform collection property of carriers. Regarding such the state as above, it is considered that the heat treatment on the conversion module 1 enables to reduce a non-uniform detecting property of the radiation detector 10 to be manufactured.

<Range of Conditions in Heat Treatment Step>

As mentioned above, a processing time as the condition in the heat treatment step S3 is preferably four hours or more. It is confirmed by experiments that an effective processing time is within thirty hours. However, this time may be longer under the conditions in which effects such as this invention may be obtained. Moreover, a processing temperature is preferably 250° C. or more. It is confirmed by the experiments that an effective processing temperature is up to 350° C. On the other hand, it is also confirmed that the phenomenon in FIG. 5 occurs in a CdTe material of mono-crystal by the heating treatment at the temperature of 380° C. Accordingly, it is expected that the processing temperature can rise up to this temperature also in this invention. The conversion layer 9 in this invention is formed by a polycrystalline film. This is because the physical properties vary by the same mechanism as a mono-crystal material when seen microscopically.

It has also been confirmed that the conversion module 1 is not damaged by the heat treatment at 500° C. Accordingly, it is expected that the processing temperature in this invention can rise up to this temperature.

As noted above, the method of manufacturing the radiation detector according to this invention includes the heat treatment step S3 of performing the heat treatment on the CdTe layer 9 composed of the chlorine-doped polycrystalline film. The heat treatment step S3 enables to achieve more even conversion layer 9. The heat treatment as above can eliminate the Zn-rich region appearing in the interface between the conversion layer 9 and the electron-injection blocking layer 7. Disappearance of such the object means that the interface between the conversion layer 9 and the electron-injection blocking layer 7 has been even. An uneven interface may cause a non-uniform conversion property of radiation or a non-uniform collection property of carriers. Regarding this, the heat treatment of the example of the invention can reduce a non-uniform detecting property of the radiation detector 10 to be manufactured.

Such a heat treatment as in the example of the invention causes chlorine atoms to be placed on the Te-site of the crystal lattice, the CdTe layer being doped with the chlorine atoms. This condition securely achieves the CdTe layer of N-type. Accordingly, heterojunction occurs between the conversion layer 9 and the electron-injection blocking layer 7, resulting in reliable collection of charges generated in the conversion layer 9. Thus, the radiation detector having high sensitivity can be manufactured. Moreover, the experiments show that the heat treatment as above can eliminate the Zn-rich region appearing in the interface between the conversion layer 9 and the electron-injection blocking layer 7. Disappearance of such the object means that the interface between the conversion layer 9 and the electron-injection blocking layer 7 has been even. An uneven interface may cause a non-uniform conversion property of radiation or a non-uniform collection property of carriers. Regarding this, the heat treatment of the example of the invention can reduce a non-uniform detecting property of the radiation detector 10 to be manufactured.

Moreover, the conversion layer 9 composed of the polycrystalline film has a problem that the charge movement is readily eliminated on an interface of crystals adjoining each other. Then, the heat treatment of the example of the invention increases the electron density in the CdTe layer, resulting in promotion of the charge movement among crystals. Consequently, the charges generated in the conversion layer 9 can be collected reliably.

This invention is applicable to manufacture of the radiation detector having the zinc-doped conversion layer 9. In addition, the heating treatment step S3 of this invention can eliminate an uneven Zn-rich region generated in the interface between the CdTe layer 9 and the electron-injection blocking layer 7.

Moreover, as noted above, the heat treatment in the inert gas atmosphere can eliminate deterioration of the conversion layer 9, resulting in manufacturing the radiation detector having higher quality.

The invention claimed is:

1. A method of manufacturing a radiation detector, comprising:
    a charge blocking layer forming step of forming a charge blocking layer on a substrate;
    a CdTe-layer forming step of forming a CdTe layer so as to cover the charge blocking layer on the substrate, the CdTe layer undergoing heterojunction to the charge blocking layer and being composed of a chlorine-doped polycrystalline film; and
    a heat treatment step of performing a heat treatment on the substrate having the CdTe layer formed thereon at a temperature and for a period of time to assure that the CdTe-layer has physical property of an n-type semiconductor layer.

2. The method of manufacturing the radiation detector according to claim 1, wherein
    in the CdTe-layer generating step, the CdTe layer is doped with zinc in addition to chlorine.

3. The method of manufacturing the radiation detector according to claim 1, wherein
    the heat treatment step is performed in an inert gas atmosphere.

4. The method of manufacturing the radiation detector according to claim 1, wherein
    the heat treatment step is performed for four hours or more within thirty hours.

5. The method of manufacturing the radiation detector according to claim 1, wherein
    the heat treatment in the heat treatment step is performed at a temperature of 250° C. or more to 500° C. or less.

6. The method of manufacturing the radiation detector according to claim 2, wherein
    the heat treatment step is performed in an inert gas atmosphere.

7. The method of manufacturing the radiation detector according to claim 2 wherein
    the heat treatment step is performed for four hours or more within thirty hours.

8. The method of manufacturing the radiation detector according to claim 3 wherein
    the heat treatment step is performed for four hours or more within thirty hours.

9. The method of manufacturing the radiation detector according to claim 2, wherein
    the heat treatment in the heat treatment step is performed at a temperature of 250° C. or more to 500° C. or less.

10. The method of manufacturing the radiation detector according to claim 3, wherein
    the heat treatment in the heat treatment step is performed at a temperature of 250° C. or more to 500° C. or less.

11. The method of manufacturing the radiation detector according to claim 4, wherein
    the heat treatment in the heat treatment step is performed at a temperature of 250° C. or more to 500° C. or less.

12. The method of manufacturing the radiation detector according to claim 1, wherein the heat treatment in the heat treatment step is performed at a temperature of 250° C. or more to 350° C. or less.

13. The method of manufacturing the radiation detector according to claim 2, wherein the heat treatment in the heat treatment step is performed at a temperature of 250° C. or more to 350° C. or less.

14. The method of manufacturing the radiation detector according to claim 3, wherein the heat treatment in the heat treatment step is performed at a temperature of 250° C. or more to 350° C. or less.

15. The method of manufacturing the radiation detector according to claim 4, wherein the heat treatment in the heat treatment step is performed at a temperature of 250° C. or more to 350° C. or less.

16. A method of manufacturing a radiation detector, comprising:
    forming a conversion module for receiving radiation and converting the received radiation received into charges;
    forming an active matrix substrate for collecting the charges from the conversion module in order to generate an image based on the received radiation, wherein
    the conversion module forming step includes:
    a charge blocking layer forming step of forming a charge blocking layer on a substrate;
    a CdTe-layer forming step of forming a CdTe layer so as to cover the charge blocking layer on the substrate, the CdTe layer undergoing heterojunction to the charge blocking layer and being composed of a chlorine-doped polycrystalline film; and
    a heat treatment step of performing a heat treatment on the substrate having the CdTe layer formed thereon at a temperature and for a period of time to assure that the CdTe-layer has physical property of an n-type semiconductor layer.

* * * * *